(12) United States Patent
Inbar et al.

(10) Patent No.: US 11,640,253 B2
(45) Date of Patent: May 2, 2023

(54) METHOD TO USE FLAT RELINK TABLE IN HMB

(71) Applicant: Western Digital Technologies, Inc., San Jose, CA (US)

(72) Inventors: Karin Inbar, Ramat Hasharon (IL); David Haliva, Kfar-Sava (IL); Gadi Vishne, Petach-Tikva (IL)

(73) Assignee: Western Digital Technologies, Inc., San Jose, CA (US)

( * ) Notice: Subject to any disclaimer, the term of this patent is extended or adjusted under 35 U.S.C. 154(b) by 28 days.

(21) Appl. No.: 17/335,863

(22) Filed: Jun. 1, 2021

(65) Prior Publication Data

US 2022/0382452 A1 Dec. 1, 2022

(51) Int. Cl.
*G06F 3/06* (2006.01)
*G06F 12/10* (2016.01)

(52) U.S. Cl.
CPC ............ *G06F 3/064* (2013.01); *G06F 3/0619* (2013.01); *G06F 3/0656* (2013.01); *G06F 3/0659* (2013.01); *G06F 3/0679* (2013.01); *G06F 12/10* (2013.01); *G06F 2212/1032* (2013.01)

(58) Field of Classification Search
CPC ...... G06F 3/064; G06F 3/0619; G06F 3/0656; G06F 3/0659; G06F 3/0679; G06F 12/10; G06F 2212/1032
See application file for complete search history.

(56) References Cited

U.S. PATENT DOCUMENTS

| 8,443,263 B2 | 5/2013 | Selinger et al. |
| 10,007,433 B2 | 6/2018 | Hahn |
| 10,157,004 B2 | 12/2018 | Michaeli |
| 2008/0082865 A1* | 4/2008 | Matsuoka .......... G11B 20/1879 714/E11.062 |
| 2020/0310677 A1 | 10/2020 | Byun |

FOREIGN PATENT DOCUMENTS

CN 108021511 A 5/2018

OTHER PUBLICATIONS

Kim et al. "HMB in DRAM-less NVMe SSDs: Their usage and effects on performance" Published Mar. 2, 2022 [online]. Retrieved from the Internet Aug. 19, 2022. Retrieved from <URL: https://journals.plos.org/plosone/article?id=10.1371/journal.pone.0229645> (Year: 2020).*

* cited by examiner

*Primary Examiner* — Masud K Khan
*Assistant Examiner* — Dustin B. Fulford
(74) *Attorney, Agent, or Firm* — Patterson + Sheridan, LLP; Steven H. VerSteeg (57) ABSTRACT

A data storage device includes a non-volatile memory (NVM) device and a controller coupled to the NVM device. The controller is configured to create a bad block table that tracks bad blocks of the NVM device, send the bad block table to a host memory location, and check the bad block table to determine whether a block to be read or written to is bad. The controller is further configured to request information on a bad block from the bad block table located in the host memory location, determine that the requested information is not available from the host memory location, and retrieve the requested information from a location separate from the host memory location. A sum of the times to generate a request to check the flat relink table, execute the request, and retrieve the requested information is less than a time to process a host command.

19 Claims, 7 Drawing Sheets

| A | B | C | D | E | F | G | H | I | J | K | L | M |
|---|---|---|---|---|---|---|---|---|---|---|---|---|
| 1 | 2 | 3 | 4 | 5 | 6 | 7 | 8 | 9 | 10 | 11 | 12 | 13 |

METHOD TO USE FLAT RELINK TABLE IN HMB

BACKGROUND OF THE DISCLOSURE

Field of the Disclosure

Embodiments of the present disclosure generally relate to data storage devices, such as solid state drives (SSDs), and storing of block mapping data.

Description of the Related Art

Logical block addresses (LBAs) of a data storage device are mapped to physical block addresses (PBAs) of the data storage device. The mapping of LBAs to PBAs may be stored in a logical to physical (L2P) table. During operations of the data storage device, physical blocks may be retired or decommissioned due to various reasons, such as a high bit error rate (BER), a high program/erase (PE) cycle count, and the like. When the physical blocks are retired, a replacement block may be retrieved from a relink table. The relink table includes a mapping between LBAs of the blocks and LBAs of the respective replacement blocks.

In a data storage device that has many blocks, the relink table has a large memory footprint in a memory device of the data storage device. For example, the memory device may be the static random access memory (SRAM) of the data storage device. In order to reduce the relink table memory footprint, the relink table includes only blocks that have replacements and the blocks are ordered by block number. However, by including only blocks that have replacements, firmware overhead may be increased due to blocks needing to be searched inside the relink table for every command regardless of there being a replacement available. As a result, the performance of the data storage device may be decreased due to the relink table search.

Therefore, there is a need in the art for an improved storage and search of a relink table of a data storage device.

SUMMARY OF THE DISCLOSURE

The present disclosure generally relates to storing of block mapping data. A data storage device includes a non-volatile memory (NVM) device and a controller coupled to the NVM device. The controller is configured to create a bad block table that tracks bad blocks of the NVM device, send the bad block table to a host memory location, and check the bad block table to determine whether a block to be read or written to is bad. The controller is further configured to request information on a bad block from the bad block table located in the host memory location, determine that the requested information is not available from the host memory location, and retrieve the requested information from a location separate from the host memory location. A sum of the times to generate a request to check the flat relink table, check the flat relink table, and retrieve the requested information is less than a time to process a host command.

In one embodiment, a data storage device includes a non-volatile memory (NVM) device and a controller coupled to the NVM device. The controller is configured to create a bad block table that tracks bad blocks of the NVM device, send the bad block table to a host memory location, and check the bad block table to determine whether a block to be read or written to is bad.

In another embodiment, a data storage device includes a non-volatile memory (NVM) device and a controller coupled to the NVM device. The controller is configured to request information on a bad block from a relink table stored in a host memory buffer (HMB), determine that the requested information is not available from the HMB, and retrieve the requested information from a location separate from the HMB.

In another embodiment, a data storage device includes memory means and a controller coupled to the memory means. The controller is configured to receive a command from a host device at a front end, pass the command to a back end, build a request at the front end to obtain replacement block information from a memory location of the host device, receive the replacement block information at the back end, and execute the command on the memory means.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to storing of block mapping data. A data storage device includes a non-volatile memory (NVM) device and a controller coupled to the NVM device. The controller is configured to create a bad block table that tracks bad blocks of the NVM device, send the bad block table to a host memory location, and check the bad block table to determine whether a block to be read or written to is bad. The controller is further configured to request information on a bad block from the bad block table located in the host memory location, determine that the requested information is not available from the host memory location, and retrieve the requested information from a location separate from the host memory location. A sum of the times to generate a request to check the flat relink table, check the flat relink table, and retrieve the requested information is less than a time to process a host command.

Figure 1:
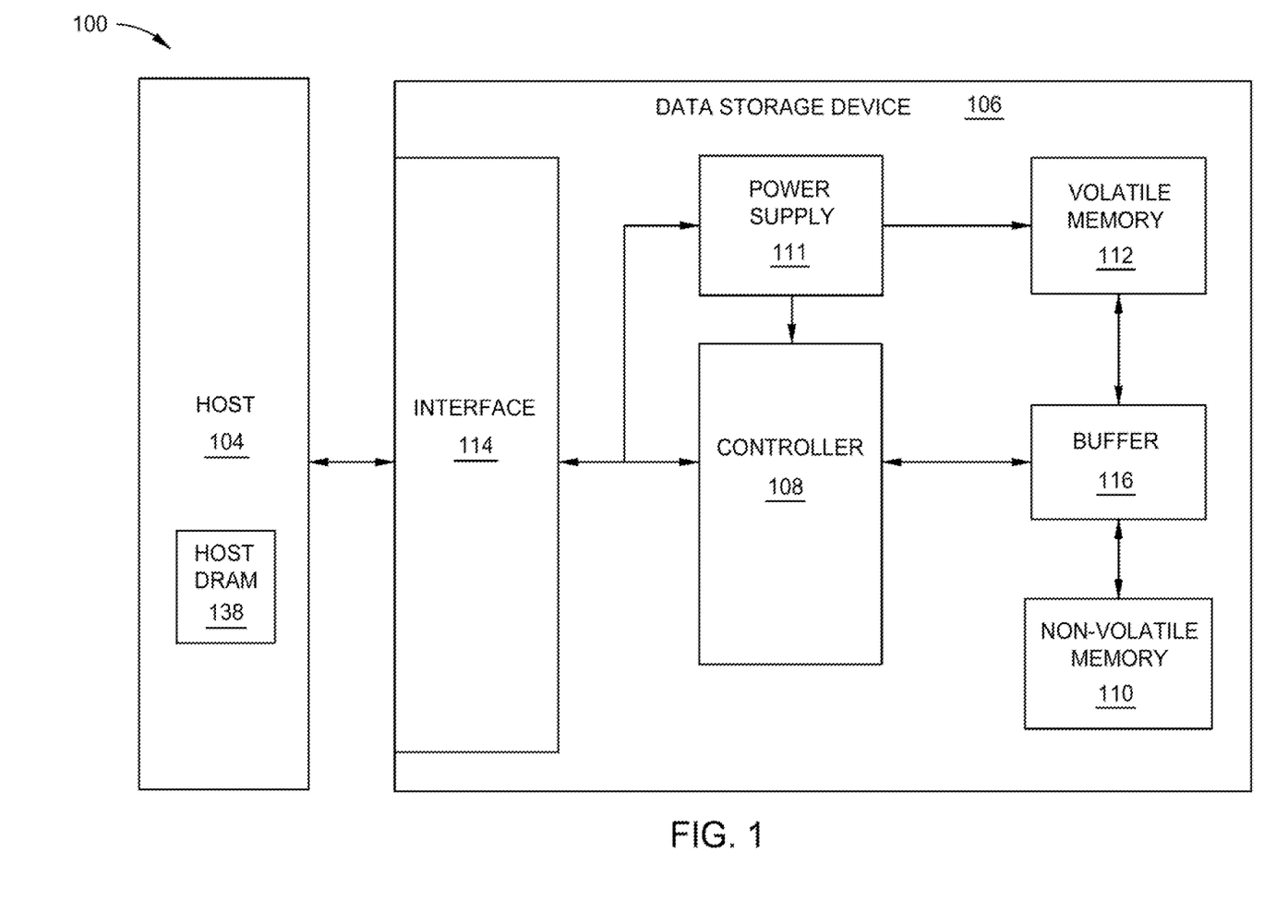
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

The interface 114 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit may receive a message from the controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an on-board backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, the controller 108 may use volatile memory 112 as a cache. For instance, the controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The controller 108 may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2:
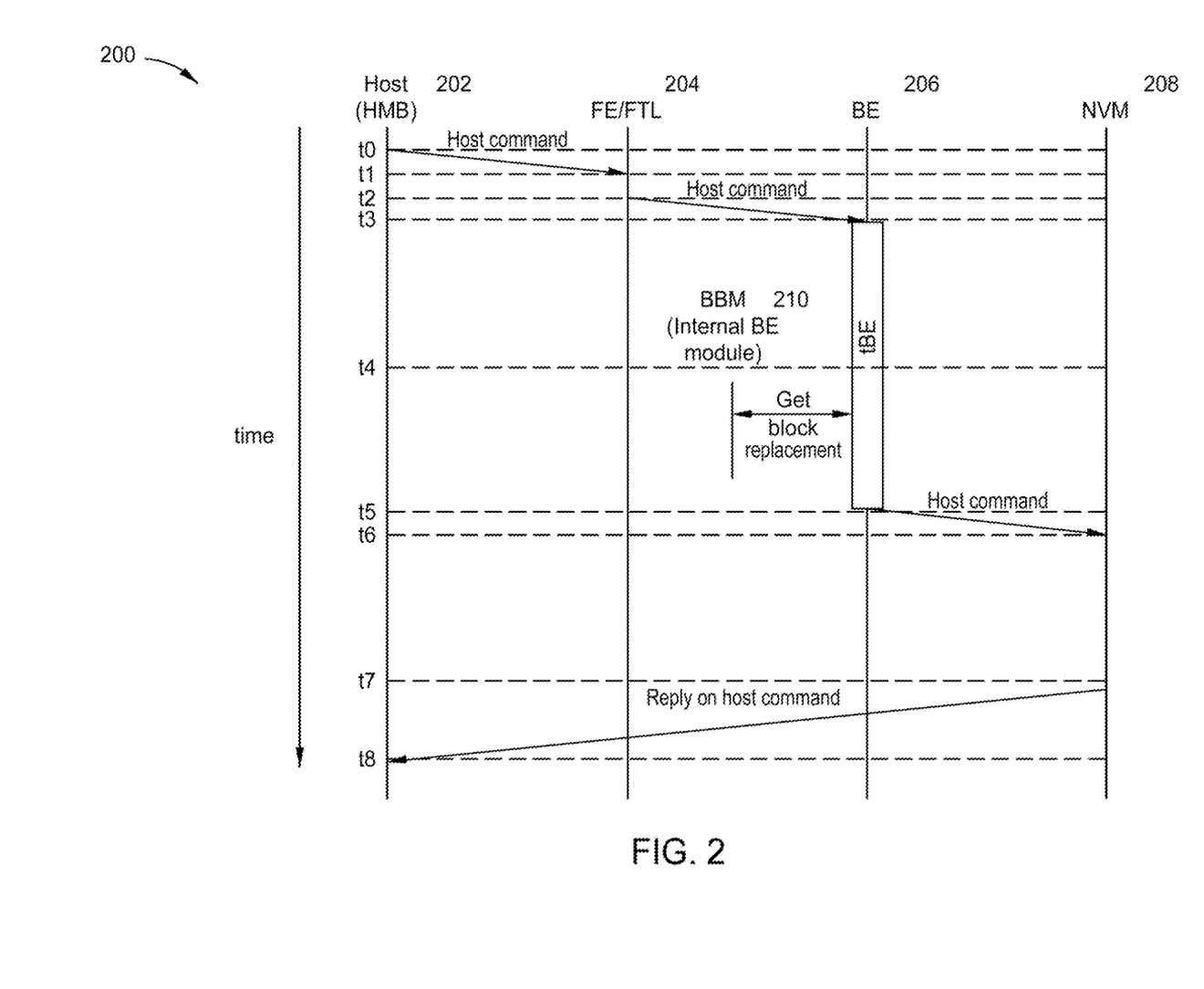
FIG. 2 is a schematic illustration of a timing diagram of executing a host command, according to certain embodiments.

FIG. 2 is a schematic illustration of a timing diagram 200 of executing a host command, according to certain embodiments. The timing diagram 200 illustrates the timing of executing a host command as the host command is passed from a host memory buffer (HMB) of a host device 202 to a data storage device, such as the data storage device 106 of FIG. 1, that includes a front end (FE)/flash translation layer (FTL) 204, a back end (BE) 206, and an NVM 208. The FE and the BE may be logic and/or firmware usable by a controller, such as the controller 108 of FIG. 1. The data storage device 106 further includes a bad block manager (BBM) 210, which is implemented, in one embodiment, as an internal BE module.

At t0, the host device 202 sends a host command the FE/FTL 204, where the FE/FTL 204 receives the host command at t1. The time between t1 and t2 may correspond to a latency or processing time of the FE/FTL 204. At t2, the host command is passed to the BE 206, where the BE 206 receives the host command at t3. At t3, the BE 206 begins to process the host command, where tBE represents the BE 206 processing time.

In some embodiments, the programmable blocks of the NVM 208 may be organized by into groups, such that each first block of each plane are grouped together into a jumboblock or a superblock. However, while reading or writing data to the NVM, a target block may be "bad," such that the target block exceeds one or more conditions. For example, the conditions may include a BER, a PE cycle count, and the like. When a target block is deemed "bad" (hereinafter "bad block"), the controller 108 may logically replace the bad block with a replacement block, such that the jumboblock no longer includes the bad block and includes the replacement block.

While the BE 206 is processing the host command, the BBM 210, at t4, retrieves a block replacement information for the target block of the host command. The tBE time duration, t3 to t5, may be dependent on the time to retrieve the block replacement information by the BBM 210. In order to replace the bad block, the BE scans a table, from time t4 to t5, for the relevant information regarding bad blocks and their replacement blocks. At t5, the processed host command is executed by the BE 206, where the target block of the processed host command is the replacement block. At t6, execution of the processed command is completed. At t7, a completion message is sent by the controller 108 after determining that the execution of the host command has completed at the NVM 208 to the host 202, where the host 202 receives the completion message at t8.

Figure 3:
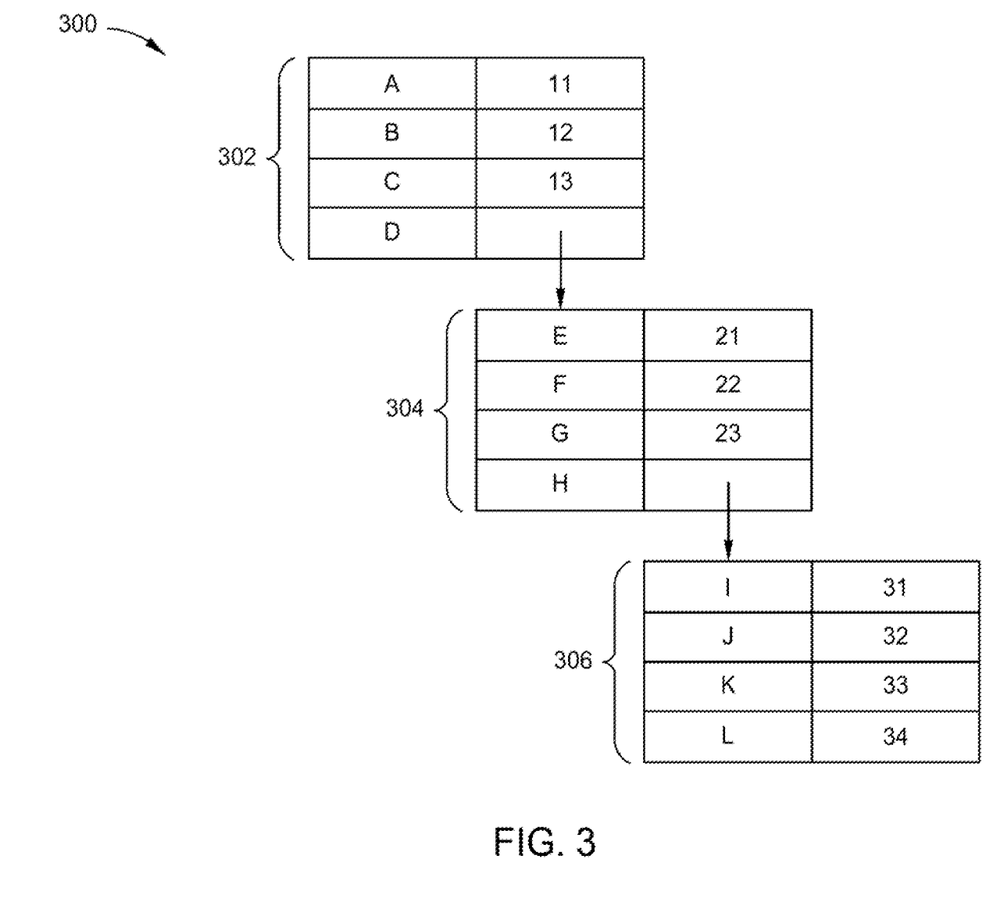
FIG. 3 is a schematic illustration of a linked list table, according to certain embodiments.

FIG. 3 is a schematic illustration of a linked list table 300, according to certain embodiments. The linked list table 300 includes a first table 302, a second table 304, and a third table 306. It is to be understood that the linked list table 300 is an example of an embodiment of a linked list table and other embodiments including more or less tables with more or less entries are contemplated. The first table 302 includes a first entry "A" corresponding to a value of 11, a second entry "B" corresponding to a value of 12, a third entry "C" corresponding to a value of 13, and a fourth entry "D" that is a pointer pointing to a first entry of the second table 304. Because the first entry "A" of the first table 302 is the first entry of the linked list table 300, the first entry "A" of the first table 302 is the head of the linked list table 300.

The second table 304 includes a first entry "E" corresponding to a value of 21, a second entry "F" corresponding to a value of 22, a third entry "G" corresponding to a value of 23, and a fourth entry "H" that is a pointer pointing to a first entry of the third table 306. The third table 306 includes a first entry "I" corresponding to a value of 31, a second entry "J" corresponding to a value of 32, a third entry "K" corresponding to a value of 33, and a fourth entry "L" corresponding to a value of 34. Because the fourth entry "L" of the third table 306 is the last entry of the linked list table 300, the fourth entry "L" of the third table 306 is the tail of the linked list table 300.

Linked list tables are a type of data structure in which each node or table has one or more values and a pointer pointing to the next node or table in the data structure. Linked list tables allow for list elements to be easily inserted or removed without reallocation or reorganization of the entire data structure because the data items need not be stored contiguously in memory. Because linked list tables may store data sets non-contiguously in the memory device, linked list tables may not require a large amount of memory since each table may be stored separately of each other and linked together using a pointer. However, storing of the linked list table may require a large bandwidth or a large time due to storing and generating of pointers pointing to the next table of the linked list table.

Furthermore, scanning the linked list table for a particular value may require a large amount of bandwidth or time as each table is scanned in order until the particular value is located. For example, when locating the value corresponding to the third entry "K" of the third table 306, the first table 302 is first scanned. Upon determining that the third entry "K" is not in the first table 302, the controller and/or firmware, such as the BE or the FE, locates the second table 304 using the pointer of the fourth entry "D" of the first table 302. The process continues until the third entry "K" of the third table 306 is found and the value corresponding to the third entry "K" of the third table 306 is returned to the controller and/or firmware. It is to be understood that other types of linked lists, such as doubly linked lists and the like, are contemplated.

Figure 4:
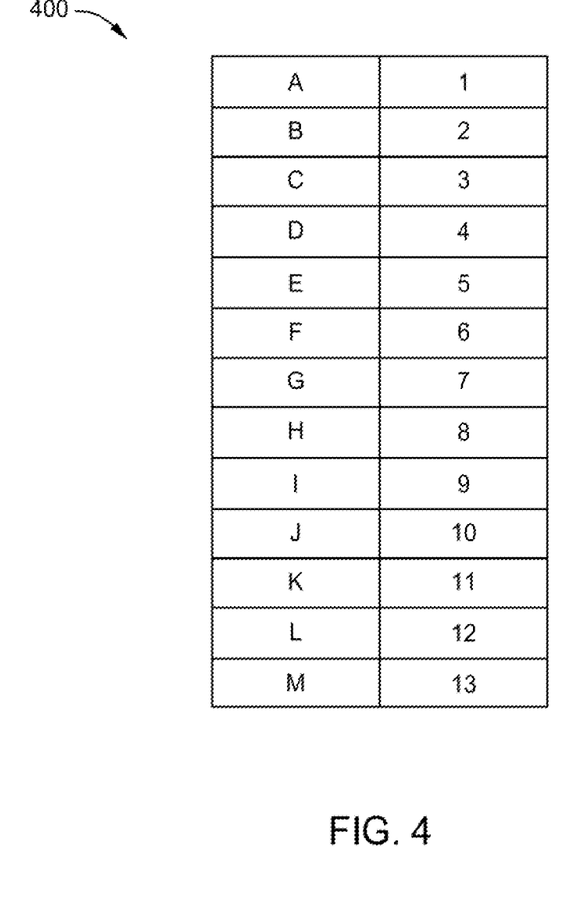
FIG. 4 is a schematic illustration of a flat table, according to certain embodiments.

FIG. 4 is a schematic illustration of a flat table 400, according to certain embodiments. The flat table 400 includes entries "A"-"M", where each entry corresponds to a value. For example, entry "A" has a value of 1, entry "B" has a value of 2, and entry "C" has a value of 3. Unlike the linked list table 300 of FIG. 3, the flat table 400 is a single table. A single read operation may be sufficient to retrieve data from the flat table 400. However, because the flat table 400 is a single table, storage of the flat table 400 may require a large amount of memory as the table cannot be split and stored separately. Thus, the flat table 400 may be stored in memory devices having large memory areas. For example, the flat table 400 may be stored in SRAM, but would require some memory area of the SRAM to be appropriated to storing the flat table 400. The amount of SRAM space necessary to store the flat table 400 would be quite large and hence, is not desirable even though the flat table provides the smallest latency in obtaining bad block information. It is to be understood the flat table 400 is an example of a possible embodiment.

Figure 5:
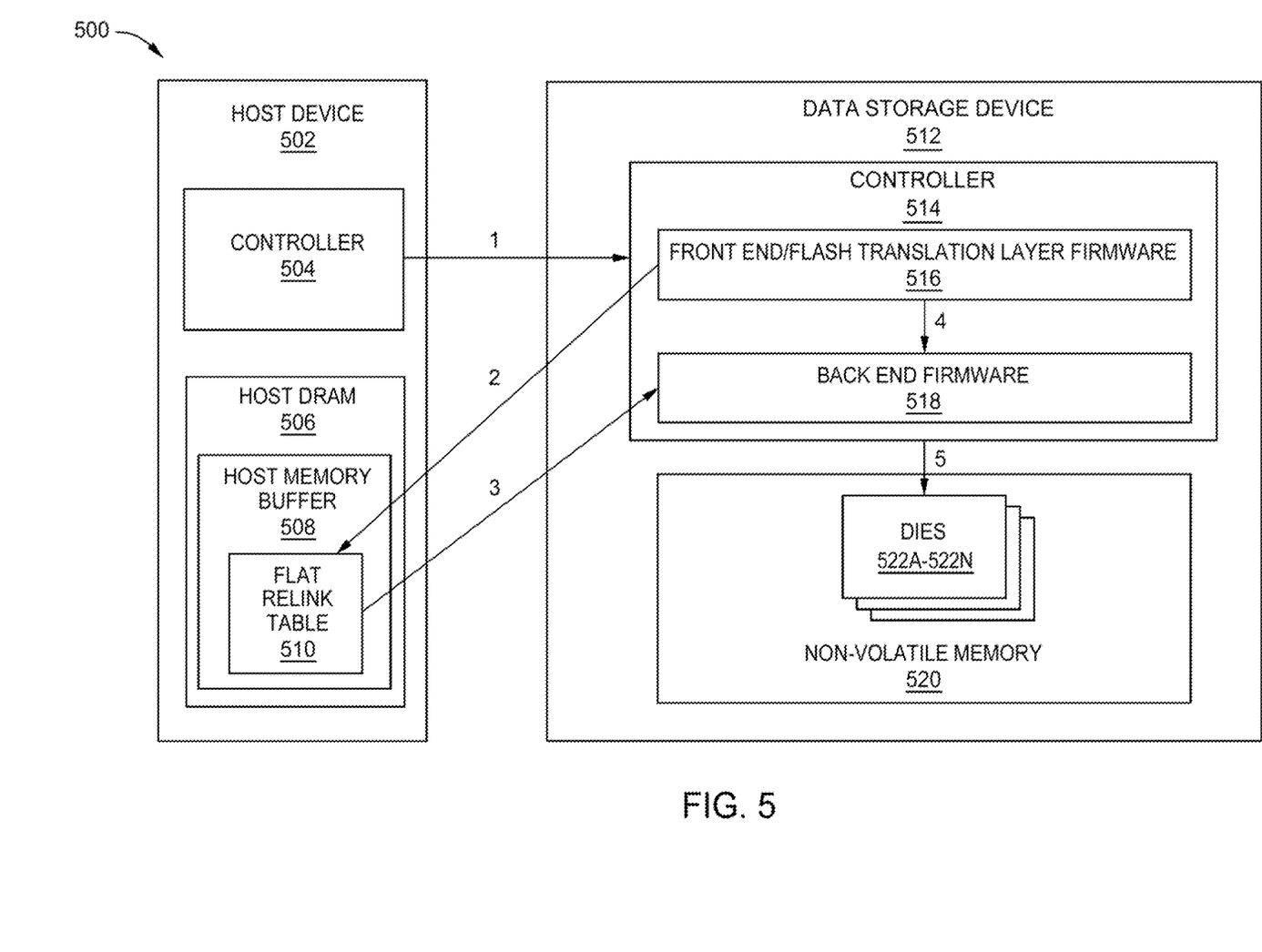
FIG. 5 is a schematic block diagram illustrating a storage system in which a data storage device may function as a storage device for a host device, according to certain embodiments.

FIG. 5 is a schematic block diagram illustrating a storage system 500 in which a data storage device 512 may function as a storage device for a host device 502, according to certain embodiments. The host device includes a host controller 504 and a host DRAM 506. The host DRAM 506 includes a host memory buffer (HMB) 508, where a flat relink table 510 is stored in the HMB 508. The HMB 508 may be an area of the host DRAM 506 appropriated by the host device 502 for use by the controller 514. The appropriation of the HMB 508 may be initiated when the data storage device 512 is connected to the host device 502.

The flat relink table 510 may be an embodiment of the flat table 400, where relink entries of the flat relink table 510 includes only blocks that have replacements and are ordered by block number. For example, the flat relink table 510 includes a record of the bad blocks of a NVM 520 and any potential replacement block for each respective bad block. In some examples, the potential replacement block may be located in a logical grouping of replacement blocks, such that the replacement block is chosen from the logical grouping. In other examples, the each bad block has a replacement block associated with the bad block.

The data storage device 512 includes the controller 514 and the NVM 520. The controller 514 includes FE/FTL firmware 516 and BE firmware 518. The FE and BE may be logic implemented by the controller 514. The NVM 520 includes a plurality of dies 522A-522N, where blocks of each die may be grouped together to form a logical unit, such as a jumboblock. For example, a first block of each plane of each die may be grouped together logically as a first jumboblock. During operation of the data storage device 512, the controller 514 may continuously update the flat relink table 510 with new or updated information regarding bad blocks of the NVM 520. In some examples, the flat relink table 510 may also be stored in a cache of an internal volatile memory, such as SRAM or DRAM, and/or the NVM 520. For example, when data is flushed from the internal volatile memory due to a power loss event, the data is flushed to the NVM 520.

During the initialization of the HMB 508, a flat relink table that is stored in the NVM 520 is copied to the HMB 508. The flat relink table that is stored in the NVM 520 is the most up-to-date version of the flat relink table. The relink table stored in the NVM 520 and the flat relink table 510 may be periodically updated, but always match so that the data of the flat relink table 510 may be protected against ungraceful shutdown events. In cases where the HMB 508 is not available and hence the flat relink table 510 cannot be accessed, the controller 514 reads the relevant information from the flat relink table stored in the NVM 520. In such a scenario, the benefits of quick access to the flat relink table 510 are lost, but the data can still be accessed by the flat relink table stored in the NVM 520. As a way of minimizing the lost benefits, a portion of the flat relink table 510 (e.g., one or more entries of the flat relink table 510) that is frequently accessed or used may be stored in a cache of the internal volatile memory, which may be accessed faster than the NVM 520.

At stream 1, the host command is sent from the host controller 504 to the controller 514. The FE/FTL firmware 516 receives a host command to access the NVM 520. While the FE/FTL firmware 516 processes the host command, the FE/FTL firmware 516 generates a HMB access command to fetch the relevant entry from the flat relink table 510. The processing of the host command may include determining the location of the target block, determining whether the host command is a read command or a write command, determining if the target block is a bad block, and the like. At stream 2, the relevant replacement block information is fetched from the flat relink table 510. In some embodiments, the relevant replacement block information may be fetched from the internal volatile memory or the NVM 520 when the HMB 508 is unavailable or when access times are greater than a threshold latency.

At stream 3, the relevant replacement block information is returned to the BE firmware 518. The fetching and returning of the relevant replacement block may take about 2 microseconds to complete. The previously listed values are not intended to be limiting, but to provide an example of a possible embodiment. In some embodiments, the fetching of the replacement block is completed prior to determining that the target block is a bad block. In another embodiment, the fetching of the replacement block is completed after determining that the target block is a bad block.

At stream 4, the processed host command is passed to the BE firmware 518. The processing of the host command by the FE/FTL firmware 516 and the passing of the processed host command to the BE firmware 518 may take about 4 microseconds to complete. Furthermore, the time to process and pass the host command is greater than the time to generate an HMB access command, search the flat relink table 510, and return the replacement block. The previously listed values are not intended to be limiting, but to provide an example of a possible embodiment. After receiving the replacement block at the BE firmware 518, the BE firmware 518 executes the processed host command. Rather than executing the processed host command to the original target block, the processed host command is executed to the replacement block. In some embodiments, stream 4 occurs simultaneously with streams 2 and 3. Furthermore, in some embodiments, the time for streams 2 and 3 to occur is equal to or less than the time for stream 4 to occur.

Figure 6:
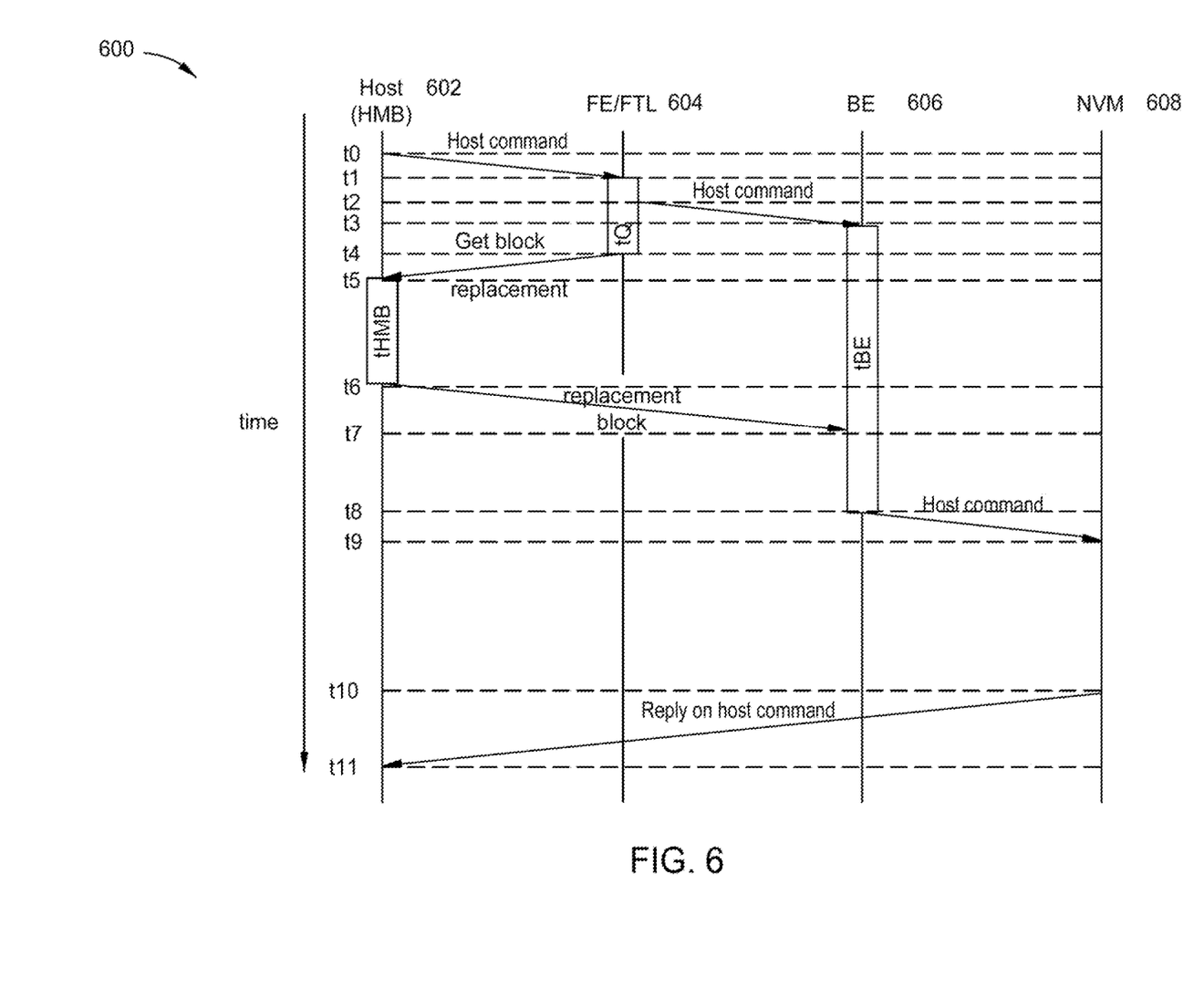
FIG. 6 is a schematic illustration of a timing diagram of executing a host command, according to certain embodiments.

FIG. 6 is a schematic illustration of a timing diagram 600 of executing a host command, according to certain embodiments. The timing diagram 600 illustrates the timing of executing a host command as the host command is passed from an HMB of a host device 602 to a data storage device, such as the data storage device 106 of FIG. 1, which includes a FE/FTL 604, a BE 606, and an NVM 608. The FE and the BE may be logic and/or firmware usable by a controller, such as the controller 108 of FIG. 1.

The host device 602 generates the host command at t0 and sends the host command to the FE/FTL 604, where the FE/FTL 604 receives the host command at t1. At t2, the host command is passed to the BE 606 and received at the BE 606 at time t3. Simultaneously, the FE/FTL 604 builds a request to retrieve the relevant replacement block information from the HMB. The time to build the request is represented by tQ, which spans the time from t2 to t4. During tQ, the FE/FTL 604 determines the target block of the host command and generates the request. In some embodiments, the FE/FTL 604 may first determine if the target block is a bad block before generating the request. In other embodiments, the FE/FTL 604 may pre-emptively generate the request prior to determining that the target block is a bad block.

At t3, the BE 606 receives the host command and begins to process the host command. The time to process the host command is represented by tBE. At t4, the FE/FTL 604 finishes building the request and executes the request to retrieve the replacement block information from the HMB. The replacement block information is stored in a flat relink table, such as the flat relink table 510 of FIG. 5. At t5, the request is received at the host device 602, where the controller 108 searches the HMB for the relevant replacement block information. The time to search the HMB is represented by tHMB, which spans the time t5 to t6. It is to be understood that the FE/FTL 604 may generate a request to search a flat relink table stored in a cache of the internal volatile memory, such as SRAM or DRAM, or the NVM 608.

Because the FE/FTL 604 is aware of whether the host device 602 has an HMB, the FE/FTL 604 may generate a request to search for the flat relink table stored in the relevant location. Rather than determining that the HMB is not present or accessible and then generating another request to search a flat relink table stored in an internal memory of the data storage device, the FE/FTL 604 may only generate the request to search the internal memory for the flat relink table entry. Furthermore, because the flat relink table may be stored in the HMB of the host device 602, a smaller copy or only a portion of the flat relink table (e.g., a flat relink table storing the most recent information) may be stored in the internal memory of the data storage device. Thus, the internal memory requirements of the data storage device may be decreased or the internal memory may be re-allocated for other storage purposes.

At t6, the replacement block information is returned to the BE 606 and received at the BE 606 at t7, where the BE 606 is still processing the host command. The sum of the times for the FE/FTL 604 to build the request, the controller 108 to search the flat relink table for the relevant replacement block, and the host device 602 to return the replacement block to the BE 606 is typically less than the sum of the times to transmit the host command from the FE/FTL 604 to the BE 606 and process the host command at the BE 606. At t8, the BE 606 finishes processing the host command and executes the host command at t9, where the target of the host command is the replacement block of the NVM 608. After executing the host command, the controller 108 generates and transmits a completion message at t10, where the host device 602 receives the completion message for the host command at t11.

Figure 7:
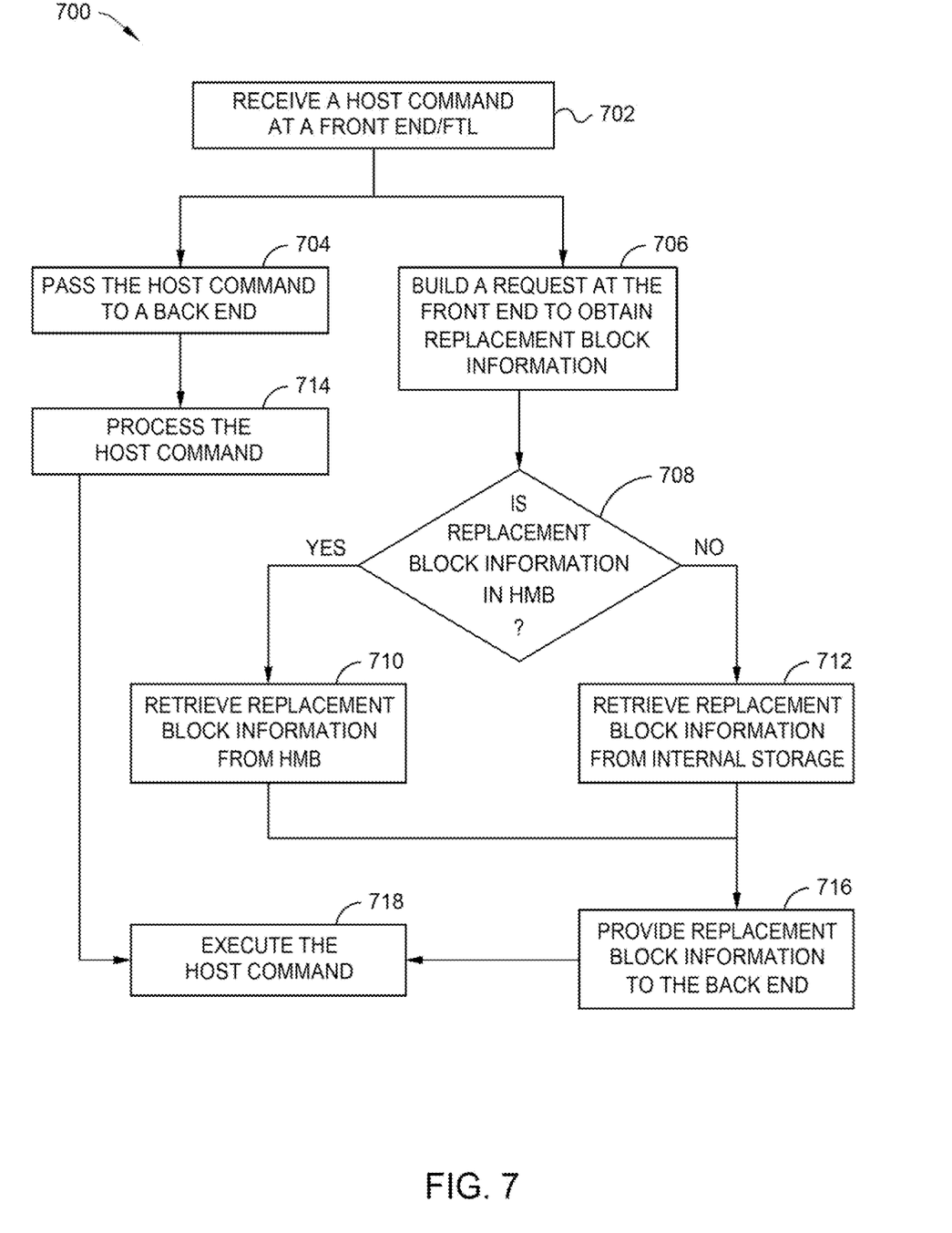
FIG. 7 is a schematic flow chart illustrating a method of executing a host command, according to certain embodiments.

FIG. 7 is a schematic flow chart illustrating a method 700 of executing a host command, according to certain embodiments. Aspects of FIG. 5 may be referenced in the description herein for exemplary purposes. At block 702, a host command is received at a FE/FTL firmware 516. Simultaneously, the FE/FTL firmware 516 passes the host command to a BE firmware 518 at block 704 and builds a request to obtain replacement block information for the target block of the host command at block 706. It is to be understood that the term "simultaneously" may refer to relatively the same time or within a threshold time of each other.

At block 706, when the FE/FTL firmware 516 builds the request, the FE/FTL firmware 516 determines the target block of the host command. The FE/FTL firmware 516 may pre-emptively build the request prior to determining that the target block is a bad block or build the request after determining that the target block is a bad block. The FE/FTL firmware 516 may check a bad block table, such as a flat relink table 510, to determine if the target block is a bad block. During operation, the controller 514 may be configured to update the bad block table upon determining that a block is a bad block. At block 708, the controller 514 and/or the FE/FTL firmware 516 determines if the replacement block information is stored in the HMB 508. If the replacement block information is stored in the HMB 508, then the FE/FTL firmware 516 retrieves the replacement block information from the flat relink table 510 stored in the HMB 508 at block 710. If the replacement block information is not stored in the HMB 508 or the HMB 508 is otherwise unaccessible, then at block 712, the FE/FTL firmware 516 retrieves the replacement block information from a cache of the relevant internal storage, such as the SRAM, DRAM, or NVM 520.

At block 716, the replacement block information is provided to the BE firmware 518. While the steps between block 706 to block 716 are occurring, the BE firmware 518 is processing the host command at block 714. The processing the host command at block 714 may require the same time or more time than the time to complete the steps between block 706 to block 716. After the BE firmware 518 completes the processing of the host command at block 714 and the replacement block information is provided to the BE firmware 518 at block 716, the host command is executed, where the target block is the replacement block.

By concurrently processing a host command and accessing a flat relink table of the HMB, the internal memory requirements of the data storage device may be decreased, the performance of executing the host command, where the target block is a bad block, may be increased, the overall execution time of the host command may be decreased, and the firmware complexity may be decreased.

In one embodiment, a data storage device includes a non-volatile memory (NVM) device and a controller coupled to the NVM device. The controller is configured to create a bad block table that tracks bad blocks of the NVM device, send the bad block table to a host memory location, and check the bad block table to determine whether a block to be read or written to is bad.

The bad block table is a flat relink table. Checking the bad block table occur simultaneous with passing a host command to a back end of the data storage device and processing the host command at the back end. Checking the bad block table occurs for a first period of time, wherein passing the host command to the back end of the data storage device and processing the host command at the back end occurs for a second period of time, and wherein the first period of time is less than or equal to the second period of time. The controller includes a front end and a back end and wherein the front end comprises a flash translation layer (FTL). The FTL is configured to build a request to check the bad block table. The host memory location is a host memory buffer (HMB). The controller is further configured to update the bad block table. The controller is further configured to provide replacement block information after checking the bad block table.

In another embodiment, a data storage device includes a non-volatile memory (NVM) device and a controller coupled to the NVM device. The controller is configured to request information on a bad block from a relink table stored in a host memory buffer (HMB), determine that the requested information is not available from the HMB, and retrieve the requested information from a location separate from the HMB.

The relink table is a flat relink table. The controller is further configured to receive a host command, build a request for the HMB, and handle the build request. A time to build a request for the location separate from the HMB plus a time to retrieve the requested information from the location separate from the HMB is greater than a time to retrieve the bad block information from the relink table in HMB. The location is the NVM device. The location is a cache disposed in a volatile memory device of the data storage device. The cache comprises one or more frequently accessed entries of the relink table In another embodiment, a data storage device includes memory means and a controller coupled to the memory means. The controller is configured to receive a command from a host device at a front end, pass the command to a back end, build a request at the front end to obtain replacement block information from a memory location of the host device, receive the replacement block information at the back end, and execute the command on the memory means.

A time to build the request plus a time to receive the replacement block information at the back end is typically less than a time for the back end to handle the request, which reduces firmware overhead and/or latency. The memory location is a host memory buffer (HMB). The replacement block information is stored as a flat relink table. The controller is configured to store the relink table in the memory means. The request is built by a flash translation layer (FTL).

While the foregoing is directed to embodiments of the present disclosure, other and further embodiments of the disclosure may be devised without departing from the basic scope thereof, and the scope thereof is determined by the claims that follow.

What is claimed is:
1. A data storage device, comprising:
a non-volatile memory (NVM) device; and
a controller coupled to the NVM device, wherein the controller is configured to:
create a bad block table that tracks bad blocks of the NVM device;
send the bad block table to a host memory location; and
check the bad block table to determine whether a block to be read or written to is bad, wherein checking the bad block table occur simultaneous with passing a host command to a back end of the data storage device and processing the host command at the back end.

2. The data storage device of claim 1, wherein the bad block table is a flat relink table.

3. The data storage device of claim 1, wherein checking the bad block table occurs for a first period of time, wherein passing the host command to the back end of the data storage device and processing the host command at the back end occurs for a second period of time, and wherein the first period of time is less than or equal to the second period of time.

4. The data storage device of claim 1, wherein the controller includes a front end and a back end and wherein the front end comprises a flash translation layer (FTL).

5. The data storage device of claim 4, wherein the FTL is configured to build a request to check the bad block table.

6. The data storage device of claim 1, wherein the host memory location is a host memory buffer (HMB).

7. The data storage device of claim 1, wherein the controller is further configured to update the bad block table.

8. The data storage device of claim 1, wherein the controller is further configured to provide replacement block information after checking the bad block table.

9. A data storage device, comprising:
a non-volatile memory (NVM) device; and
a controller coupled to the NVM device, wherein the controller is configured to:
request information on a bad block from a relink table stored in a host memory buffer (HMB), wherein requesting information on the bad block from the relink table occurs simultaneous with passing a host command to a back end of the data storage device and processing the host command at the back end;
determine that the requested information is not available from the HMB; and
retrieve the requested information from a location separate from the HMB.

10. The data storage device of claim 9, wherein the relink table is a flat relink table.

11. The data storage device of claim 9, wherein the controller is further configured to:
receive the host command;
build a request for the HMB; and
handle the build request.

12. The data storage device of claim 9, wherein a time to build a request for the location separate from the HMB plus a time to retrieve the requested information from the location separate from the HMB is greater than a time to request information on the bad block from a relink table stored in the HMB.

13. The data storage device of claim 9, wherein the location separate from the HMB is the NVM device.

14. The data storage device of claim 9, wherein the location is a cache disposed in a volatile memory device of the data storage device, and wherein the cache comprises one or more frequently accessed entries of the relink table.

15. A data storage device, comprising:
memory means; and a controller coupled to the memory means, wherein the controller is configured to:
  receive a command from a host device at a front end;
  pass the command to a back end;
  build a request at the front end to obtain replacement block information from a memory location of the host device;
  receive the replacement block information at the back end, wherein receiving the replacement block information at the back end occurs simultaneous with passing the command to the back end of the data storage device and processing the command at the back end; and
  execute the command on the memory means.

16. The data storage device of claim 15, wherein a time to build the request plus a time to receive the replacement block information at the back end is less than a time for the back end to handle the request, which reduces firmware overhead and/or latency.

17. The data storage device of claim 15, wherein the memory location is a host memory buffer (HMB), and wherein the replacement block information is stored as a flat relink table.

18. The data storage device of claim 17, wherein the controller is configured to store the flat relink table in the memory means.

19. The data storage device of claim 15, wherein the request is built by a flash translation layer (FTL).

* * * * *